(12) United States Patent
Park et al.

(10) Patent No.: US 8,994,058 B2
(45) Date of Patent: Mar. 31, 2015

(54) LIGHT EMITTING DEVICE HAVING AN OHMIC LAYER WITH A PLURALITY OF PROTRUDING CONTACT PORTIONS

(71) Applicant: LG Innotek Co., Ltd., Seoul (KR)

(72) Inventors: BumDoo Park, Seoul (KR); TaeJin Kim, Seoul (KR); MinSuk Kim, Seoul (KR); YeongUn Seong, Seoul (KR); SangJun Lee, Seoul (KR); TaeYong Lee, Seoul (KR); KiYong Hong, Seoul (KR); SonKyo Hwang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/167,803

(22) Filed: Jan. 29, 2014

(65) Prior Publication Data

US 2014/0209959 A1    Jul. 31, 2014

(30) Foreign Application Priority Data

Jan. 30, 2013  (KR) .......................... 10-2013-0010620
Aug. 2, 2013   (KR) .......................... 10-2013-0092120

(51) Int. Cl.
| H01L 33/00 | (2010.01) |
| H01L 21/00 | (2006.01) |
| H01L 33/42 | (2010.01) |
| H01L 33/62 | (2010.01) |
| H01L 33/40 | (2010.01) |
| H01L 27/15 | (2006.01) |
| H01L 33/38 | (2010.01) |

(52) U.S. Cl.
CPC ................ *H01L 33/42* (2013.01); *H01L 33/62* (2013.01); *H01L 33/405* (2013.01); *H01L 33/40* (2013.01); *H01L 27/156* (2013.01); *H01L 33/387* (2013.01); *H01L 2224/48091* (2013.01); *H01L 2924/0002* (2013.01)
USPC .................. 257/98; 257/99; 257/432; 438/29; 438/121

(58) Field of Classification Search
CPC ....... H01L 33/387; H01L 33/62; H01L 33/42; H01L 33/405; H01L 27/156
See application file for complete search history.

(56) References Cited

U.S. PATENT DOCUMENTS

| 8,421,112 | B2* | 4/2013 | Jeong et al. ...................... 257/99 |
| 8,643,040 | B2* | 2/2014 | Lee et al. ......................... 257/98 |
| 8,766,287 | B2* | 7/2014 | Moon et al. ...................... 257/88 |
| 2011/0024776 | A1* | 2/2011 | Kim et al. ........................ 257/94 |
| 2011/0227109 | A1* | 9/2011 | Kim et al. ........................ 257/98 |
| 2012/0032218 | A1* | 2/2012 | Choi et al. ....................... 257/98 |
| 2012/0104444 | A1* | 5/2012 | Hwang et al. ................... 257/98 |
| 2012/0138969 | A1* | 6/2012 | Moon et al. ...................... 257/88 |
| 2012/0235168 | A1* | 9/2012 | Katsuno et al. ................. 257/88 |
| 2012/0256210 | A1* | 10/2012 | Moon et al. ...................... 257/94 |
| 2013/0113007 | A1* | 5/2013 | Choi ................................ 257/98 |
| 2013/0285095 | A1* | 10/2013 | Moon .............................. 257/98 |
| 2014/0145233 | A1* | 5/2014 | Lee et al. ......................... 257/98 |

* cited by examiner

*Primary Examiner* — Alonzo Chambliss (74) *Attorney, Agent, or Firm* — Birch, Stewart, Kolasch & Birch, LLP (57) ABSTRACT

Disclosed is a light emitting device including a conductive substrate, a first electrode layer disposed on the conductive substrate, a light emitting structure disposed on the first electrode layer, the light emitting structure including a first semiconductor layer, a second semiconductor layer, and an active layer disposed between the first semiconductor layer and the second semiconductor layer, and a second electrode layer electrically connected to the second semiconductor layer, wherein the first electrode layer includes a transparent electrode layer disposed between the conductive substrate and the first semiconductor layer, and an ohmic layer comprising a plurality of metal contact portions vertically passing through the transparent electrode layer, wherein each metal contact portion includes AuBe.

20 Claims, 11 Drawing Sheets

LIGHT EMITTING DEVICE HAVING AN OHMIC LAYER WITH A PLURALITY OF PROTRUDING CONTACT PORTIONS

CROSS-REFERENCE TO RELATED APPLICATION

This application claims the priority benefit of Korean Patent Application No. 10-2013-0010620, filed on Jan. 30, 2013, and No. 10-2013-0092120, filed on Aug. 2, 2013 in the Korean Intellectual Property Office, the disclosure of which is incorporated herein by reference.

BACKGROUND

1. Field

Embodiments relate to a light emitting device.

2. Description of the Related Art

A light emitting diode (LED) as a representative example of a light emitting device is a device which converts electrical signals into infrared light, visible light or light using characteristics of compound semiconductors. LEDs are now being applied to devices such as home appliances, remote controls, electronic signboards, displays, a variety of automatic appliances and the like and applications thereof continue to expand.

Generally, a miniaturized LED is fabricated as a surface mount device so as to be directly mounted to a printed circuit board (PCB). Accordingly, an LED lamp used as a display device is also developed as a surface mount device. Such a surface mount device may replace conventional simple luminaires and is used in lighting displays, character displays, image displays and the like, rendering various colors.

As the application range of LEDs extends, luminance required for lights for daily use and lights for distress signals increases. Accordingly, it is important to increase luminance of LEDs.

In addition, electrodes of light emitting devices should have superior adhesion and electrical properties.

In addition, research to improve luminance of light emitting devices and reduce operating voltage is underway.

SUMMARY

Embodiments provide a light emitting device which reduces forward voltage (VF) and improves luminous efficacy.

In one embodiment, a light emitting device includes a conductive substrate, a first electrode layer disposed on the conductive substrate, a light emitting structure disposed on the first electrode layer, the light emitting structure including a first semiconductor layer, a second semiconductor layer, and an active layer disposed between the first semiconductor layer and the second semiconductor layer, and a second electrode layer electrically connected to the second semiconductor layer, wherein the first electrode layer includes a transparent electrode layer disposed between the conductive substrate and the first semiconductor layer, and an ohmic layer including a plurality of metal contact portions vertically passing through the transparent electrode layer, wherein each metal contact portion includes AuBe.

The light emitting device may further include a window layer disposed between the first electrode layer and the first semiconductor layer, wherein the window layer includes a doping region doped with a dopant having the same polarity as the first semiconductor layer in an area in which the window layer contacts the metal contact portion.

A planar area of the transparent electrode layer may be greater than a planar area of the metal contact portion.

The doping region may protrude from the surface of the window layer.

BRIEF DESCRIPTION OF THE DRAWINGS

Details of the embodiments will be more clearly understood from the following detailed description taken in conjunction with the accompanying drawings, in which.

DETAILED DESCRIPTION OF EMBODIMENTS

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted to avoid obscuring appreciation of the disclosure by a person of ordinary skill in the art. Wherever possible, the same reference numbers will be used throughout the drawings to refer to the same or like parts.

Spatially relative terms such as "below", "beneath", "lower", "above", or "upper" may be used herein to describe one element's relationship to another element as illustrated in the figures. It will be understood that spatially relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience of description and clarity. Also, the size or area of each constituent element does not entirely reflect the actual size thereof.

Angles or directions used to describe the structures of light emitting devices according to embodiments are based on those shown in the drawings. Unless there is, in the specification, no definition of a reference point to describe angular positional relations in the structures of the light emitting devices, the associated drawings may be referred to.

Figure 1:
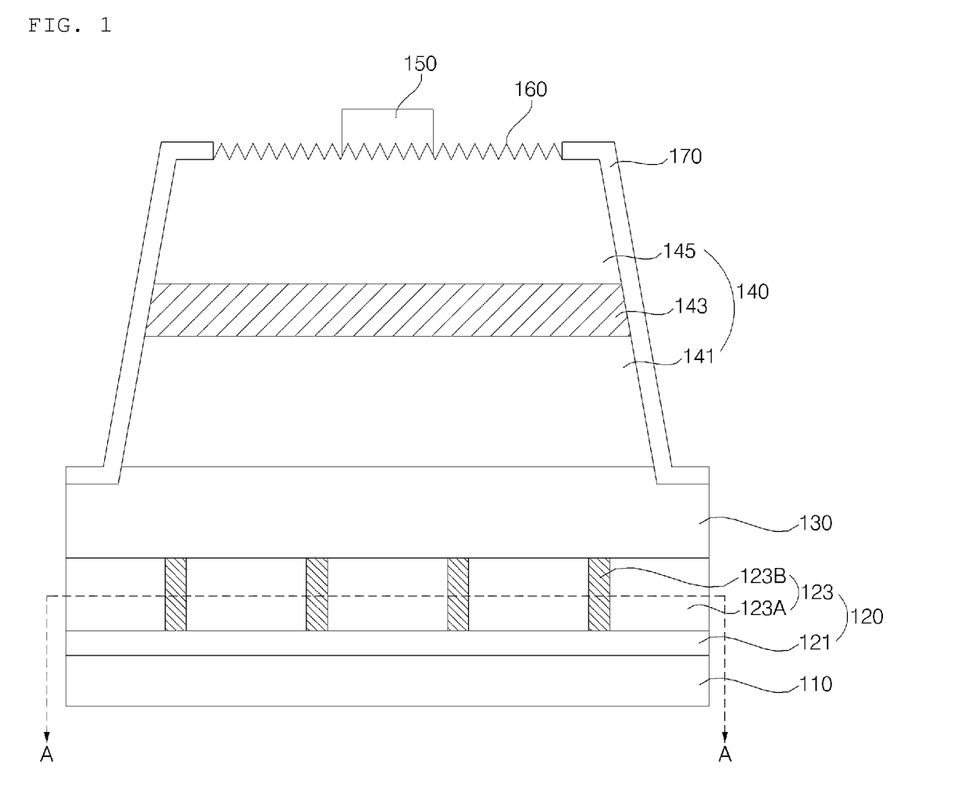
FIG. 1 is a sectional view illustrating a light emitting device according to an embodiment.
Figure 2:
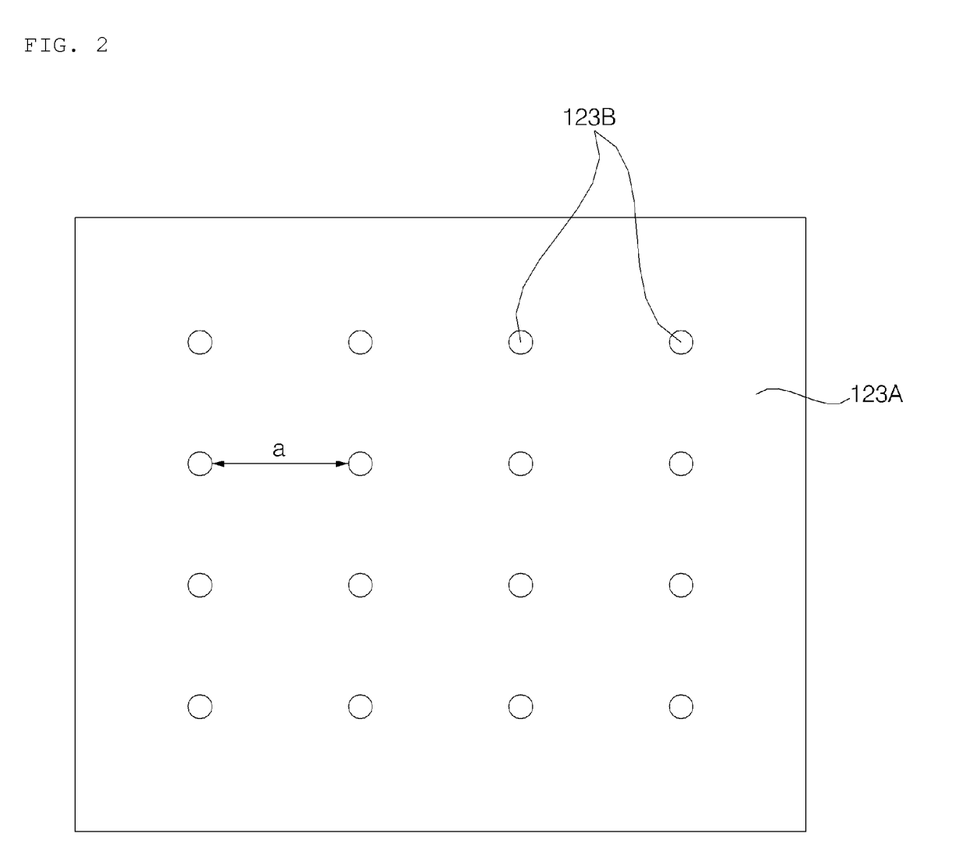
FIG. 2 is a sectional plan view of an ohmic layer taken along the line A-A of FIG. 1.

FIG. 1 is a sectional view illustrating a light emitting device according to an embodiment and FIG. 2 is a sectional plan view of an ohmic layer taken along the line A-A of FIG. 1.

Referring to FIG. 1, the light emitting device 100 according to the present embodiment includes a conductive substrate 110, a first electrode layer 120 disposed on the conductive substrate 110, a light emitting structure 140 including a first semiconductor layer 141, a second semiconductor layer 145 disposed above the first electrode layer 120, and an active layer 143 disposed between the first semiconductor layer 141 and the second semiconductor layer 145, and a second electrode layer 150 electrically connected to the second semiconductor layer 145.

The conductive substrate 110 supports the light emitting structure 140 and the conductive substrate 110 together with the second electrode layer 150 supplies power to the light emitting structure 140. The conductive substrate 110 may be formed of a highly thermally conductive material or a conductive material, for example, at least one selected from the group consisting of gold (Au), nickel (Ni), tungsten (W), molybdenum (Mo), copper (Cu), aluminum (Al), tantalum (Ta), silver (Ag), platinum (Pt), chromium (Cr), Si, Ge, GaAs, ZnO, GaN, $Ga_2O_3$, SiC, SiGe and CuW, or an alloy of two or more thereof, or a stack of two or more different substances thereof. That is, the conductive substrate 110 may be implemented as a carrier wafer.

The conductive substrate 110 facilitates conduction of heat emitted from the light emitting device 100 and thereby improves thermal stability of the light emitting device 100.

In the present embodiment, the conductive substrate 110 has conductivity. However, the conductive substrate may not have conductivity, but the disclosure is not limited thereto.

The light emitting device includes the first electrode layer 120 to supply power, disposed on the conductive substrate 110. Detailed description of the first electrode layer 120 will be given later.

The light emitting device may further include a window layer 130 to reduce the difference in reflectivity between the first electrode layer 120 and the light emitting structure 140, disposed on the first electrode layer 120.

The window layer 130 reduces the difference in reflectivity between the light emitting structure 140 and the first electrode layer 120 and thereby improves light extraction efficiency.

Specifically, the window layer 130 is disposed between the first semiconductor layer 141 and the first electrode layer 120.

The window layer 130 may include at least one of GaP, GaAsP or AlGaAs.

The light emitting structure 140 includes the first semiconductor layer 141, the second semiconductor layer 145 and the active layer 143 disposed between the first semiconductor layer 141 and the second semiconductor layer 145.

The second semiconductor layer 145 may be an n-type semiconductor layer and the n-type semiconductor layer may be doped with a semiconductor material having a formula of $In_xAl_yGa_{1-x-y}N$ ($0 \leq x \leq 1$, $0 \leq y \leq 1$, $0 \leq x+y \leq 1$) which is for example at least one selected from a group consisting of GaN, AlN, AlGaN, InGaN, InN, InAlGaN and AlInN, or the n-type semiconductor layer may be doped with an n-type dopant such as Si, Ge, Sn, Se or Te. In addition, the second semiconductor layer 145 may be selected from semiconductor materials having a formula of $(Al_xGa_{1-x})_{0.5}In_{0.5}P$.

Meanwhile, the second electrode layer 150 electrically connected to the second semiconductor layer 145 may be disposed on the second semiconductor layer 145 and the second electrode layer 150 may include at least one pad and/or at least one electrode having a predetermined pattern. The second electrode layer 150 may be disposed in central, outside or edge portions of an upper surface of the second semiconductor layer 145, but the disclosure is not limited thereto. The second electrode layer 150 may be disposed in other portions rather than portions of the upper surface of the second semiconductor layer 145, but the disclosure is not limited thereto.

The second electrode layer 150 may be formed as a monolayer or multilayer structure using a conductive material, for example, at least one of metal selected from the group consisting of In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or an alloy thereof.

A roughness pattern 160 to improve light extraction efficiency may be formed in a part or entire region of the surface of the second semiconductor layer 145, in which the second electrode layer 150 is not formed, by a predetermined etching method.

In the present embodiment, the second electrode layer 150 is formed on a flat surface on which the roughness pattern 160 is not formed, but the second electrode layer 150 may be formed on the upper surface of the second semiconductor layer 145 in which the roughness pattern 160 is formed, but the disclosure is not limited thereto.

The roughness pattern 160 may be formed by etching at least one portion of the upper surface of the second semiconductor layer 145, but the disclosure is not limited thereto. The etching process includes a wet and/or dry etching process. After the etching process, the upper surface of the second semiconductor layer 145 may have the roughness pattern 160. The roughness pattern 160 having a random size may be irregularly formed, but the disclosure is not limited thereto.

The roughness pattern 160 is a non-flat surface and includes at least one of a texture pattern, a roughness pattern and an uneven pattern.

A side cross-section of the roughness pattern 160 may be formed to have various shapes, such as cylindrical, polyprism, conical, polypyramidal, circular truncated conical, hexagonal and frusto pyramidal shapes and include a conical or polypyramidal shape.

Meanwhile, the roughness pattern 160 may be formed by a method such as photo=electro-chemical (PEC) etching, but the disclosure is not limited thereto. As the roughness pattern 160 is formed on the upper surface of the second semiconductor layer 145, a phenomenon in which light generated by the active layer 143 is total-reflected from the upper surface of the second semiconductor layer 145 and is then re-absorbed or scattered is prevented, thereby contributing to improvement of light extraction efficiency of the light emitting device 100.

The active layer 143 may be disposed under the second semiconductor layer 145. The active layer 143 is an area in which electrons recombine with holes and generate light having a wavelength corresponding to transition to a lower energy level upon recombination therebetween.

The active layer 143 may, for example, have a single quantum well structure or a multi-quantum well (MQW) structure including a semiconductor material having a formula of a $In_xAl_yGa_{1-x-y}N$ ($0 \leq x \leq 1$, $0 \leq y \leq 1$, $0 \leq x+y \leq 1$)). In addition, the active layer 143 may be selected from semiconductor materials having a formula of $(Al_xGa_{1-x})_{0.5}In_{0.5}P$.

Accordingly, more electrons are collected to a low energy level of a quantum well layer and, as a result, the probability of recombination of electrons with holes increases and luminous efficacy is thus improved. In addition, the active layer 143 may have a quantum wire structure or a quantum dot structure.

The first semiconductor layer 141 may be formed under the active layer 143. The first semiconductor layer 141 may be implemented with a p-type semiconductor layer and enable injection of holes into the active layer 143. For example, the p-type semiconductor layer may be formed of a semiconductor material having a formula of $In_xAl_yGa_{1-x-y}N$ ($0 \leq x \leq 1$, $0 \leq y \leq 1$, $0 \leq x+y \leq 1$) wherein the semiconductor material is for example selected from GaN, AlN, AlGaN, InGaN, InN, InAlGaN and AlInN, and the p-type semiconductor layer may be doped with a p-type dopant such as Mg, Zn, Ca, Sr or Ba. In addition, the first semiconductor layer 141 may be selected from semiconductor materials having a formula of $(Al_xGa_{1-x})_{0.5}In_{0.5}P$.

In addition, a third semiconductor layer (not shown) may be formed under the first semiconductor layer 141. The third semiconductor layer may be implemented with a semiconductor layer having a polarity opposite to the second semiconductor layer.

Meanwhile, the second semiconductor layer 145, the active layer 143 and the first semiconductor layer 141 may be formed by a method such as metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE) and sputtering, but the disclosure is not limited thereto.

In addition, unlike what has been described above, in an embodiment, the second semiconductor layer 145 may be a p-type semiconductor layer and the first semiconductor layer 141 may be an n-type semiconductor layer, but the disclosure is not limited thereto. Accordingly, the light emitting structure 140 may have at least one of N—P, P—N, N—P—N and P—N—P junction structures.

In addition, a passivation 170 may be formed in a part or the entirety of an outer circumferential surface of the light emitting structure 140 to protect the light emitting device from exterior shock and prevent short-circuit.

Referring to FIGS. 1 and 2, the first electrode layer 120 may include a metal or a light-transmitting conductive layer and supply power to the light emitting structure 140. The first electrode layer 120 may be formed of a conductive material, for example, at least one selected from the group consisting of nickel (Ni), platinum (Pt), ruthenium (Ru), iridium (Ir), rhodium (Rh), tantalum (Ta), molybdenum (Mo), titanium (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO), indium zinc oxide (IZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), $IrO_x$, $RuO_x$, $RuO_x$/ITO, $Ni/IrO_x/Au$, and $Ni/IrO_x/Au/ITO$, but the disclosure is not limited thereto.

The first electrode layer 120 may include at least one of an ohmic layer 123 and a metal reflective layer 125. In addition, the first electrode layer 120 may include at least one of the ohmic layer 123, the metal reflective layer 125 and a metal adhesive layer 121.

For example, the first electrode layer 120 may have a structure in which the metal reflective layer 125 and the ohmic layer 123 are stacked in this order on the metal adhesive layer 121. FIG. 1 shows a configuration in which the ohmic layer 123 is disposed on the metal adhesive layer 121.

The ohmic layer 123 may include a transparent electrode layer 123A disposed between the conductive substrate 110 and the light emitting structure 140 and a plurality of metal contact portions 123B vertically passing through the transparent electrode layer 123A.

The transparent electrode layer 123A may be formed of a material which exhibits conductivity while transmitting light reflected by the conductive substrate 110 or the metal reflective layer 125. For example, the transparent electrode layer 123A may include at least one of $In_2O_3$, $SnO_2$, ZnO, ITO, CTO, $CuAlO_2$, $CuGaO_2$ and $SrCu_2O_2$.

The plural metal contact portions 123B are disposed such that they vertically pass through the transparent electrode layer 123A. The metal contact portions 123B may be regularly spaced apart from each other by a predetermined distance. The metal contact portions 123B has a characteristic of ohmic-contact with the light emitting structure 140.

In addition, at least one surface of the metal contact portions 123B may contact the first semiconductor layer 141 of the light emitting structure 140 and the other surface thereof may contact the conductive substrate 110.

The metal contact portions 123B include AuBe. In addition, the metal contact portions 123B may include Au or a Au alloy.

When the metal contact portions 123B are disposed to pass through the transparent electrode layer 123A, there is an advantage in that they readily contact electrically the light emitting structure 140. In addition, as the metal contact portions 123B pass through the transparent electrode layer 123A, heat generated by the light emitting structure 140 is advantageously readily discharged to the conductive substrate 110.

In addition, the metal contact portion 123B directly contacts the light emitting structure 140, thus advantageously decreasing forward voltage (VF). In particular, operating voltage is decreased by about 10%, as compared to a case in which the metal contact portions 123B do not pass through the transparent electrode layer 123A. The reason for this is that the transparent electrode layer 123A has lower conductivity than the metal contact portion 123B.

In particular, referring to FIG. 2, a planar area of the transparent electrode layer 123A may be larger than a planar area of the metal contact portion 123B. The planar area of the metal contact portion 123B may be 10% to 25% with respect to the planar area of the transparent electrode layer 123A. When the planar area of the metal contact portion 123B is less than 10% with respect to the planar area of the transparent electrode layer 123A, it is difficult to form the ohmic contact between the light emitting structure 140 and the first electrode layer 120 and when the planar area of the metal contact portion 123B is greater than 25% with respect to the planar area of the transparent electrode layer 123A, luminous efficacy of the light emitting device 100 is disadvantageously deteriorated due to low light transmittance of the metal contact portion 123B.

For example, the distance between adjacent metal contact portions 123B is 35 μm to 50 μm and a width of the metal contact portions 123B is 10 μm to 20 μm so as to adjust the planar area of the metal contact portion 123B to 10% to 25% with respect to the planar area of the transparent electrode layer 123A.

The metal contact portions 123B may have a rod shape, but the disclosure is not limited thereto. the metal contact portions may have a cylindrical or polyprism shape.

The first electrode layer 120 may be flat, as shown in FIG. 1, but the disclosure is not limited. The first electrode layer 120 may have a step.

The first electrode layer 120 may further include a metal adhesive layer 121.

The metal adhesive layer 121 is formed under the ohmic layer 123 and reinforces adhesion between layers. The metal adhesive layer 121 may be formed of a material having superior adhesion to lower materials. For example, the metal adhesive layer 121 may include at least one of a PbSn alloy, a AuGe alloy, a AuBe alloy, a AuSn alloy, Sn, In, a SnIn alloy or a PdIn alloy. In addition, an anti-diffusion film (not shown) may be further disposed on the metal adhesive layer 121. The anti-diffusion film prevents materials for the conductive substrate 110 and the metal adhesive layer 121 from diffusing to the light emitting structure 140. The anti-diffusion film may be formed of a material preventing diffusion of metals and the material for example includes at least one of platinum (Pt), palladium (Pd), tungsten (W), nickel (Ni), ruthenium (Ru), molybdenum (Mo), iridium (Ir), rhodium (Rh), tantalum (Ta), hafnium (Hf), zirconium (Zr), niobium (Nb) and vanadium (V), and alloys of two or more thereof, but the disclosure is not limited thereto. The metal adhesive layer 121 may have a mono or multi-layer structure.

Figure 3:
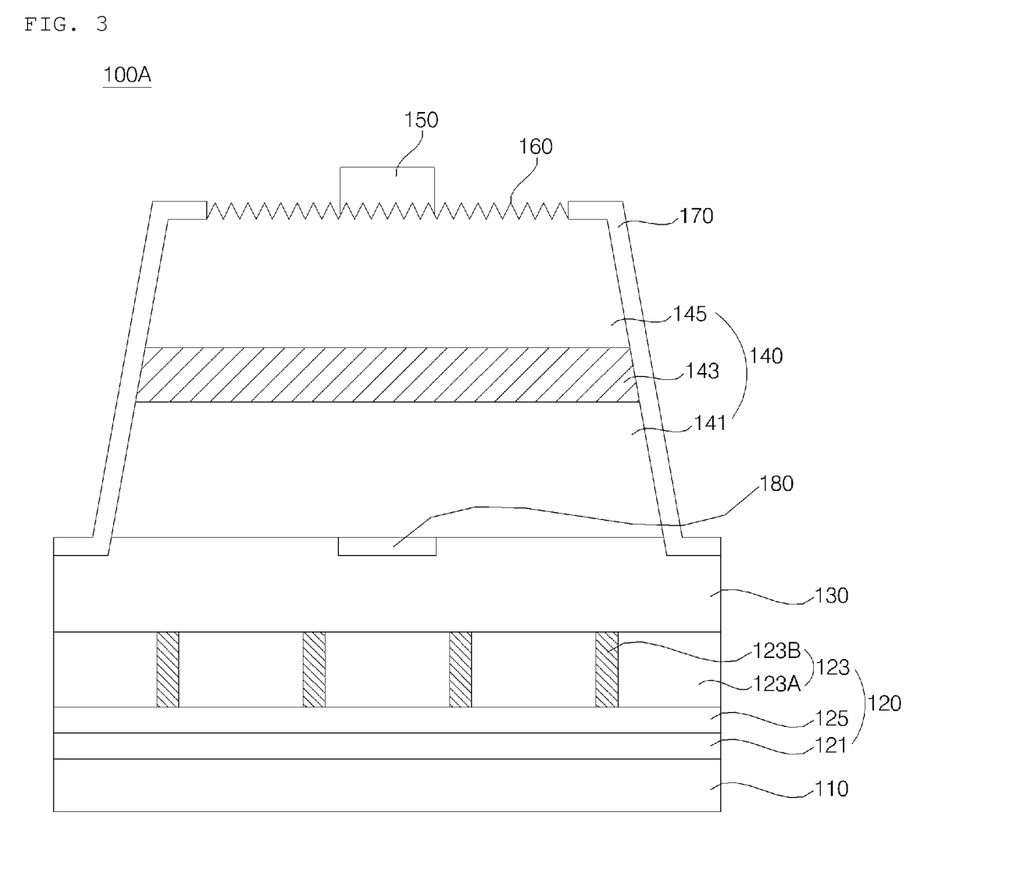
FIG. 3 is a sectional view illustrating a light emitting device according to an embodiment.

FIG. 3 is a sectional view illustrating a light emitting device according to another embodiment.

Referring to FIG. 3, the light emitting device 100A may further include a metal reflective layer 125 and a current blocking layer 180, when compared to the embodiment shown in FIG. 1.

The first electrode layer 120 may further include a metal reflective layer 125. The metal reflective layer 125 is disposed below the ohmic layer 123 and reflects the light emitting from the active layer 143 toward the conductive substrate 110 to an upward of the light emitting structure 140.

The metal reflective layer 125 may be formed of a highly reflective material, for example, Ag, Ni, Al, Rh, Pd, Ir, Ru, Mg, Zn, Pt, Au, or Hf or a combination thereof, or may be formed as a multilayer structure using a metal material and a light-transmitting conductive material such as IZO, IZTO, IAZO, IGZO, IGTO, AZO, or ATO. In addition, the reflective layer (not shown) may have a stack structure of IZO/Ni, AZO/Ag, IZO/Ag/Ni, or AZO/Ag/Ni.

The current blocking layer 180 may be disposed under the light emitting structure 140 such that at least one portion of the current blocking layer 180 overlaps the second electrode layer 150 in a vertical direction and have lower electrical conductivity than the ohmic layer 123 or the metal reflective layer 125. For example, the current blocking layer 180 may include at least one of aluminum oxide ($Al_2O_3$), silicon oxide ($SiO_2$), silicon nitride ($Si_3N_4$). titanium oxide ($TiO_x$), indium tin oxide (ITO), aluminum zinc oxide (AZO) and indium zinc oxide (IZO), but the disclosure is not limited thereto.

The current blocking layer 180 may be an electron blocking layer which prevents a phenomenon in which, upon application of high current, electrons injected into the active layer 143 from the second semiconductor layer 145 are not recombined with holes in the active layer 143 and enter the first electrode layer 120. The current blocking layer 180 has a larger band gap than the active layer 143, thereby preventing the phenomenon in which electrons injected into the active layer 143 from the second semiconductor layer 145 are not recombined in the active layer 143 and enter the first electrode layer 120. As a result, the probability of recombination of electrons with holes in the active layer 143 is increased and leakage current is prevented.

Figure 4:
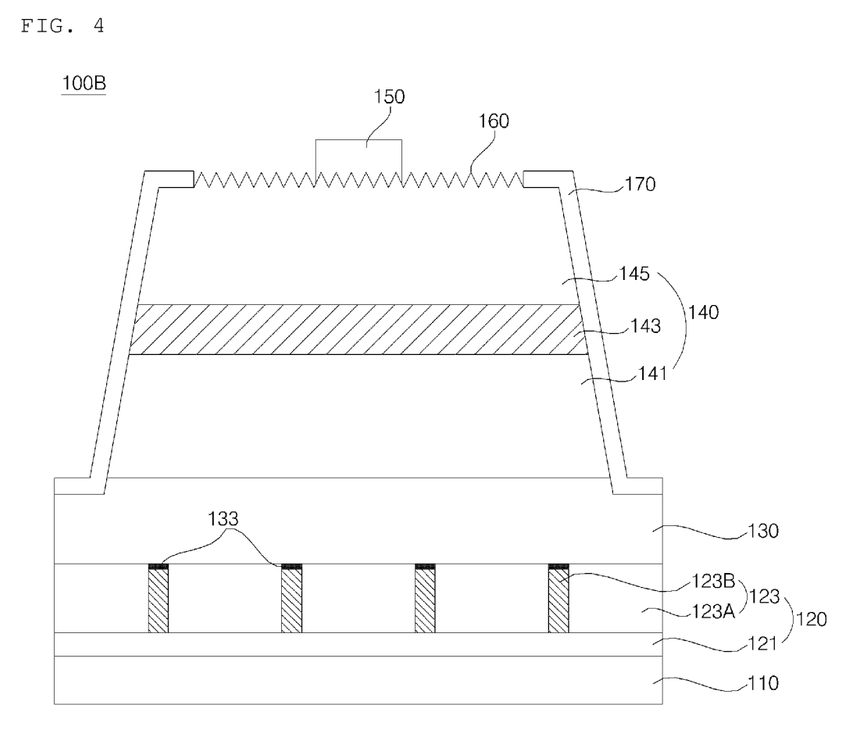
FIG. 4 is a sectional view illustrating a light emitting device according to another embodiment.

FIG. 4 is a sectional view illustrating a light emitting device according to another embodiment.

Referring to FIG. 4, the light emitting device 100B according to the present embodiment is different from the embodiment shown in FIG. 1 in that a plurality of doping regions 133 are further formed in the window layer 130.

The doping regions 133 doped with impurities may be formed in areas in which the window layer 130 contacts the metal contact portions 123B.

The doping regions 133 are formed in the areas in which the window layer 130 contacts the metal contact portions 123B and are preferably doped with a dopant having the same polarity as the first semiconductor layer 141. Because the present embodiment is provided under the assumption that the first semiconductor layer 141 is doped with a p-type dopant, the description is given under the assumption that the doping regions 133 are doped with a p-type dopant.

When the window layer 130 is doped, transmittance of light decreases, but the capacity of the window layer 130 to contact electrically the metal contact portion 123B increases. Accordingly, the doping regions 133 are formed only in inner areas of the window layer 130 contacting the metal contact portions 123B, thus bringing the window layer 130 into ohmic-contact with the metal contact portions 123B.

In addition, the doping region 133 in the window layer 130 decreases and light transmittance is not greatly deteriorated. As a result of formation of the doping regions 133 in the window layer 130, the window layer 130 contacts electrically the metal contact portions 123B without greatly decreasing light transmittance of the window layer 130.

In addition, as the window layer 130 contacts electrically the metal contact portions 123B, advantageously, operating voltage of the light emitting device 100 decreases, light transmittance of the window layer 130 is not greatly deteriorated and luminous efficacy of the light emitting device is not greatly deteriorated.

The p-type dopant doped into the doping regions 133 of the window layer 130 may include at least one of Mg, Zn, Ca, Sr, Ba and C.

When the doping regions 133 are doped at an excessively high concentration, light transmittance is remarkably deteriorated, and when the doping regions 133 are doped at an excessively low concentration, it is difficult to form an ohmic-contact between the window layer 130 and the metal contact portion 123B. Accordingly, when the doping regions 133 are doped with Mg, a doping concentration is preferably $5\times10^{18}/cm^3$ to $1\times10^{18}/cm^3$ and, when the doping region 133 is doped with C, a doping concentration is preferably $5\times10^{19}/cm^3$ to $1\times10^{19}/cm^3$.

The doping regions 133 may be spaced from one another in the window layer 130 to form a dot or island pattern. The doping regions 133 are disposed such that they correspond to the metal contact portions 123B and hereinafter, only the metal contact portion 123B will be described.

The doping regions 133 may be formed to a predetermined depth from the surface of the window layer 130. In addition, the doping regions 133 may protrude from the surface of the window layer 130. That is, the entire surface of the window layer 130 is doped and the surface of the window layer 130 is etched in the process of etching areas excluding the doping regions 133 so that the doping regions 133 protrude from the surface of the window layer 130, but the disclosure is not limited thereto.

A planar area of the doping region 133 may be equal to a planar area of the metal contact portion 123B. When the planar area of the doping region 133 is excessively small, ohmic-contact between the window layer 130 and the metal contact portion 123B may be difficult and when the planar area is excessively large, luminous efficacy of the light emitting device is greatly deteriorated.

A distance between adjacent doping regions 133 may be equal to a distance between adjacent metal contact portions 123B.

Figure 5:
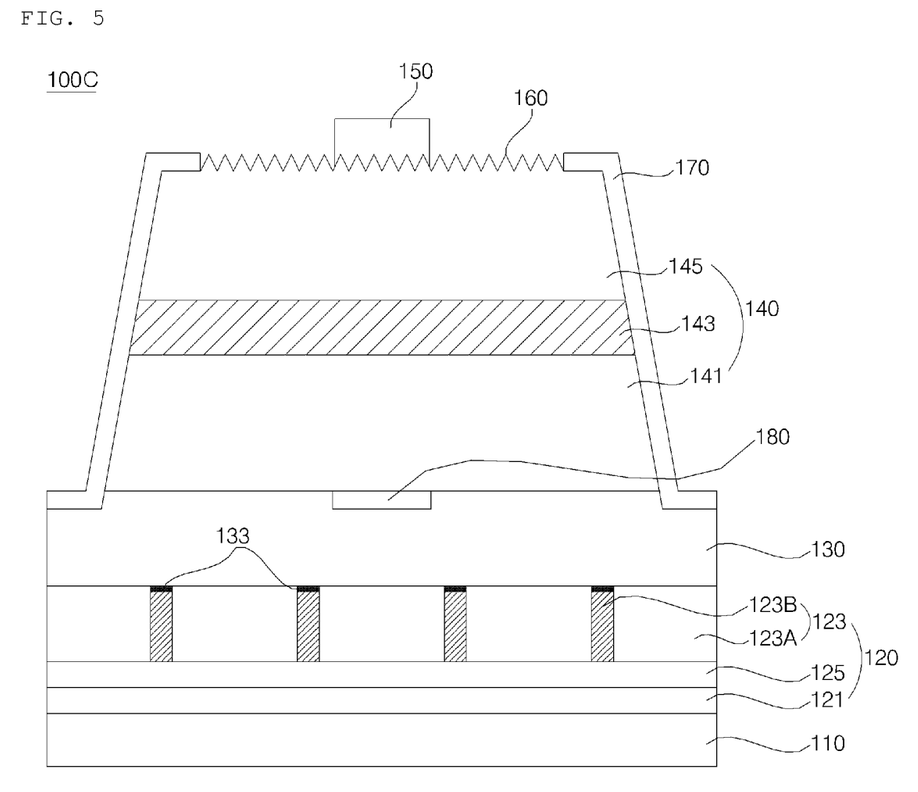
FIG. 5 is a sectional view illustrating a light emitting device according to another embodiment.

FIG. 5 is a sectional view illustrating a light emitting device according to another embodiment.

Referring to FIG. 5, the light emitting device 100C according to the present embodiment is different from the embodiment shown in FIG. 3, in that the doping region 133 is further formed in the window layer 130.

The doping region 133 has been described above.

Figure 6:
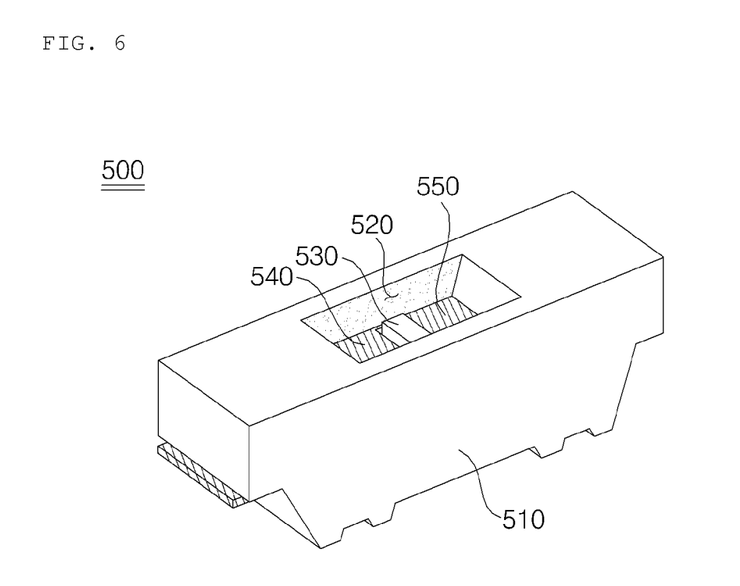
FIG. 6 is a perspective view illustrating a light emitting device package including a light emitting device according to an embodiment.
Figure 7:
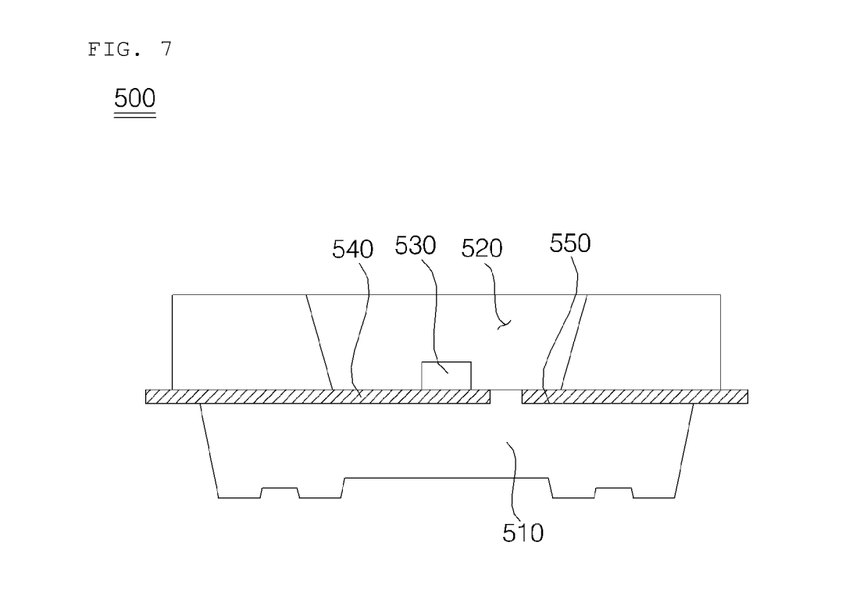
FIG. 7 is a sectional view illustrating the light emitting device package including the light emitting device according to the present embodiment.

FIG. 6 is a perspective view illustrating a light emitting device package including a light emitting device according to an embodiment and FIG. 7 is a sectional view illustrating a light emitting device package including the light emitting device according to the present embodiment.

Referring to FIGS. 6 and 7, a light emitting device package 500 includes a body 510 provided with a cavity 520, first and second lead frames 540 and 550 mounted on the body 510, a light emitting device 530 electrically connected to the first and second lead frames 540 and 550, and a sealant (not shown) filling the cavity 520 to cover the light emitting device 530.

The body 510 may be composed of at least one selected from resin materials such as polyphthalamide (PPA), silicon (Si), aluminum (Al), aluminum nitride (AlN), photosensitive glass (PSG), polyamide9T (PA9T), syndiotactic polystyrene (SPS), metal materials, sapphire ($Al_2O_3$), beryllium oxide (BeO) and printed circuit boards (PCB). The body 510 may be formed by a process such as injection molding and etching, but the disclosure is not limited thereto.

The inner surface of the body 510 may be provided with an inclined surface. A reflective angle of light emitted from the light emitting device 530 may be changed depending on an angle of the inclined surface. Accordingly, the orientation angle of light discharged to the outside can be controlled.

As the orientation angle of light decreases, convergence of light emitted from the light emitting device 530 to the outside increases. On the other hand, as the orientation angle of light increases, convergence of light from the light emitting device 530 to the outside decreases.

Meanwhile, as seen from above, the cavity 520 provided in the body 510 may have various shapes including, but not limited to, a circular shape, a rectangular shape, a polygonal shape, an oval shape and a shape with curved corners.

The light emitting device 530 is mounted on the first lead frame 540 and examples thereof include, but are not limited to, light emitting devices emitting red, green, blue or white light, and light emitting devices emitting ultraviolet light. Further, one or more light emitting devices 530 including the light emitting device 530 may be mounted on the first lead frame 540.

Further, the light emitting device 530 may be applied to all of a horizontal light emitting device, in which all electrical terminals thereof are formed on the upper surface, a vertical light emitting device, in which electrical terminals thereof are formed on the upper or lower surface, and a flip chip light emitting device.

The cavity 520 is filled with the sealant (not shown) such that the sealant covers the light emitting device 530.

The sealant (not shown) may be composed of silicone, epoxy or other resin material and may be formed by filling the cavity 520 with a sealant, followed by UV or heat curing.

In addition, the sealant (not shown) may include a phosphor, and a type of the phosphor is selected in consideration of the wavelength of light emitted from the light emitting device 530 to allow the light emitting device package 500 to render white light.

According to wavelength of light emitted from the light emitting device 530, the phosphor may include at least one of a blue light emitting phosphor, a blue-green light emitting phosphor, a green light emitting phosphor, a yellowish green light emitting phosphor, a yellow light emitting phosphor, a yellowish red light emitting phosphor, an orange light emitting phosphor and a red light emitting phosphor.

That is, the phosphor is excited by first light emitted from the light emitting device 530 to produce second light. For example, in a case where the light emitting device 530 is a blue light emitting diode and the phosphor is a yellow phosphor, the yellow phosphor is excited by blue light to emit yellow light, blue light emitted from the blue light emitting diode is mixed with yellow light excited and generated by blue light to allow the light emitting device package 500 to render white light.

Similarly, in the case where the light emitting device 530 is a green light emitting diode, a magenta phosphor or a combination of blue and red phosphors may be used, and in the case where the light emitting device 530 is a red light emitting diode, a cyan phosphor or a combination of blue and green phosphors may be used.

Such a phosphor may be selected from known phosphors such as YAG, TAG, sulfides, silicates, aluminates, nitrides, carbides, nitridosililcates, borates, fluorides and phosphates.

The first and second lead frames 540 and 550 may include a metal material selected from titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), iron (Fe), and alloys thereof. In addition, the first and second lead frames 540 and 550 may have a monolayer or multilayer structure, but are not limited thereto.

The first and second lead frames 540 and 550 are spaced from and electrically separated from each other. The light emitting device 530 is mounted on the first and second lead frames 540 and 550, and the first and second lead frames 540 and 550 directly contact the light emitting device 530, or are electrically connected thereto through a conductive material such as a soldering member (not shown). In addition, the light emitting device 530 may be electrically connected to the first and second lead frames 540 and 550 via wire bonding, although the present invention is not limited thereto. Accordingly, when a power supply is connected to the first and second lead frames 540 and 550, power may be supplied to the light emitting device 530. Meanwhile, plural lead frames (not shown) are mounted in the body 510 and respective lead frames (not shown) are electrically connected to the light emitting device 530, although the disclosure is not limited thereto.

Figure 8:
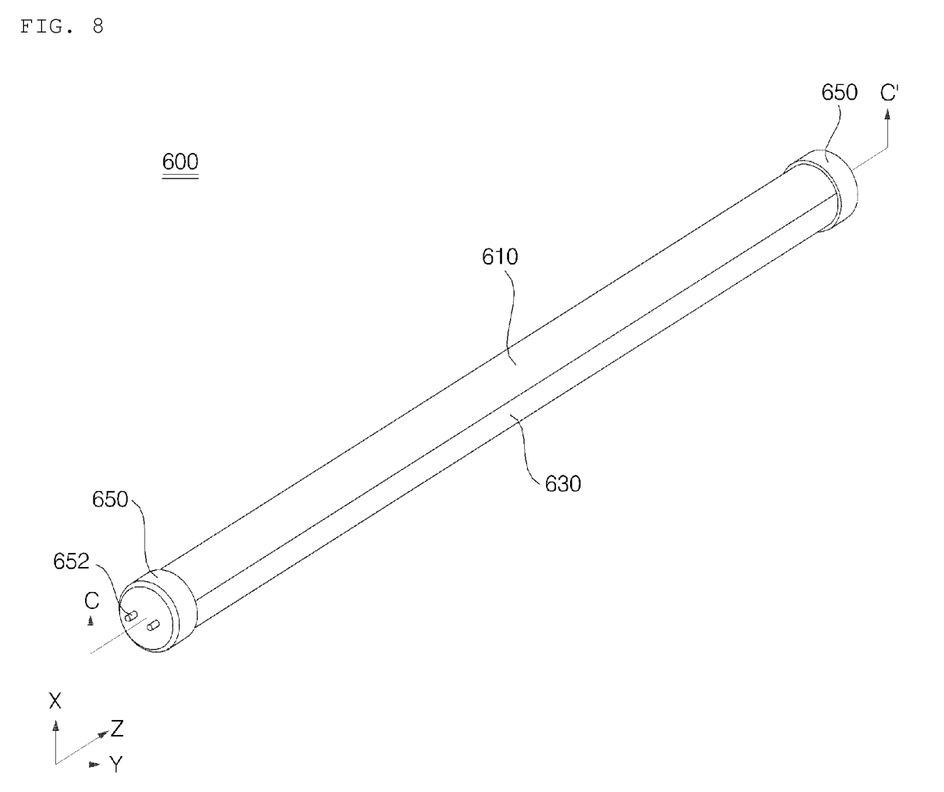
FIG. 8 is an exploded perspective view illustrating a lighting system including a light emitting device according to an embodiment.
Figure 9:
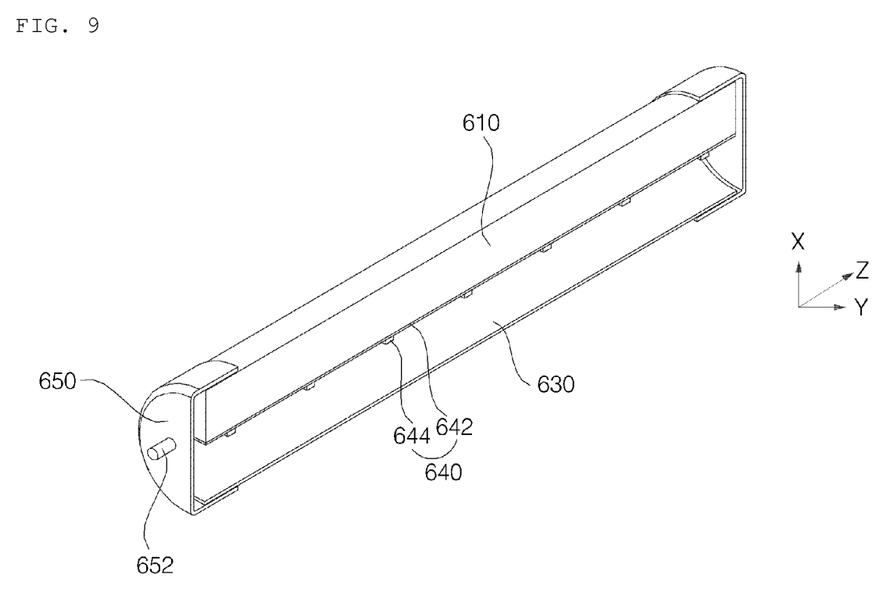
FIG. 9 is a sectional view illustrating a cross-section C-C' of the lighting system of FIG. 8.

FIG. 8 is a perspective view illustrating a lighting system including the light emitting device according to an embodiment. FIG. 9 is a sectional view illustrating a cross-section C-C' of the lighting system of FIG. 8.

Referring to FIGS. 8 and 9, the lighting device 600 may include a body 610, a cover 630 connected to the body 610 and an end cap 650 disposed at both ends of the body 610.

A light emitting device module 640 is connected to the bottom of the body 610 and the body 610 may be composed of a metal material which exhibits superior conductivity and heat emission effects in order to discharge heat generated from the light emitting device package 644 to the outside through the top of the body 610.

The light emitting device packages 644 having multiple colors are mounted on the PCB 642 in multiple rows to constitute an array, and may be mounted thereon such that they are spaced from one another by a predetermined distance or by different distances, as necessary, to control brightness. The PCB 642 may be a metal core PCB (MPPCB) or PCB made of FR4.

The light emitting device package 644 includes an extended lead frame (not shown), thereby improving heat radiation, enhancing reliability and efficiency of the light emitting device packages 644, and extending lifespan of the light emitting device package 644 and the lighting device 600 including the light emitting device package 644.

The cover 630 may take the shape of a circle such that it surrounds the bottom of the body 610, but the disclosure is not limited thereto.

The cover 630 protects the light emitting device module 640 disposed therein from exterior foreign substances. In addition, the cover 630 prevents glare generated by the light emitting device package 644 and includes diffusion particles to uniformly discharge light to the outside. In addition, a prism pattern or the like may be formed on at least one of the inner and outer surfaces of the cover 630. Alternatively, a phosphor may be applied to at least one of the inner and outer surfaces of the cover 630.

Meanwhile, the cover 630 should exhibit superior light transmittance because light generated from the light emitting device package 644 is discharged to the outside through the cover 630, and the cover 630 should exhibit sufficient heat resistance in order to endure heat generated by the light emitting device package 644. Preferably, the cover 630 is composed of a material including polyethylene terephthalate (PET), polycarbonate (PC), polymethyl methacrylate (PMMA) and the like.

Figure 10:
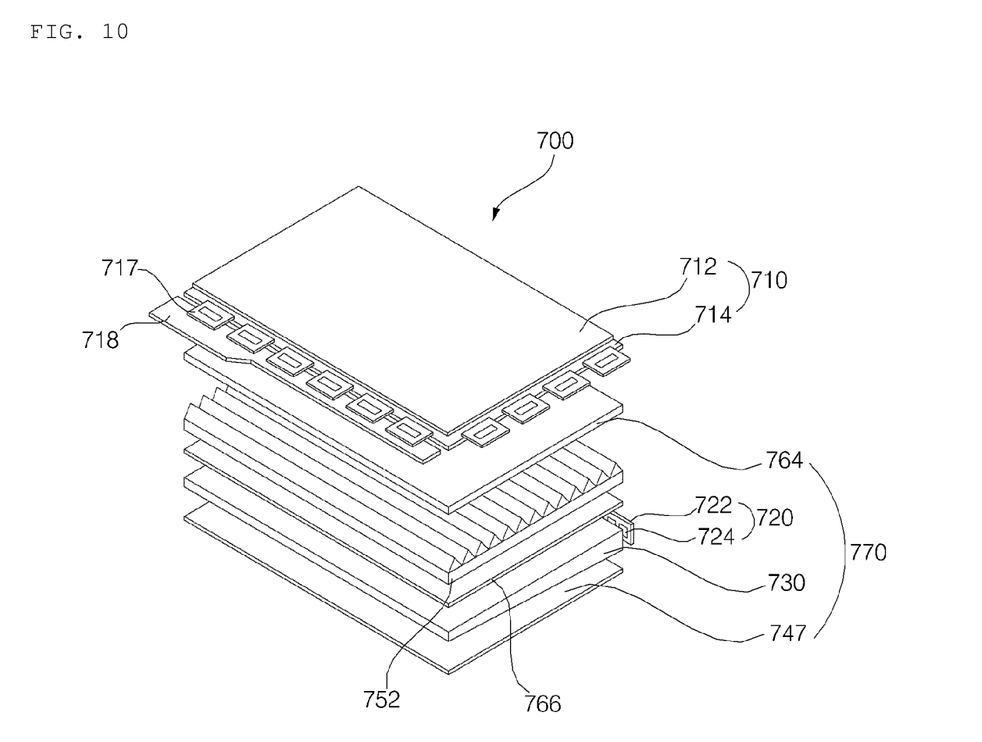
FIG. 10 is an exploded perspective view illustrating a liquid crystal device including a light emitting device according to one embodiment.

The end cap 650 is disposed on both ends of the body 610 and may be used to seal a power device (not shown). In addition, the end cap 650 is provided with a power pin 652, allowing the lighting device 600 to be applied to a conventional terminal from which a fluorescent light has been removed, without using any additional device. FIG. 10 is an exploded perspective view illustrating a liquid crystal display including a light emitting device according to an embodiment.

FIG. 10 illustrates an edge-light type liquid crystal display device 700 which includes a liquid crystal display panel 710 and a backlight unit 770 to supply light to the liquid crystal display panel 710.

The liquid crystal display panel 710 displays an image using light supplied from the backlight unit 770. The liquid crystal display panel 710 includes a color filter substrate 712 and a thin film transistor substrate 714 which face each other via a liquid crystal disposed therebetween.

The color filter substrate 712 can realize color of images to be displayed through the liquid crystal display panel 710.

The thin film transistor substrate 714 is electrically connected to a printed circuit board 718, on which a plurality of circuit components are mounted, through a driving film 717. The thin film transistor substrate 714 may apply drive voltage supplied from the printed circuit board 718 to the liquid crystal in response to drive signals supplied from the printed circuit board 718.

The thin film transistor substrate 714 includes a thin film transistor and a pixel electrode formed as a thin film on another substrate composed of a transparent material such as glass or plastic.

The backlight unit 770 includes a light emitting device module 720 to emit light, a light guide plate 730 to convert light emitted from the light emitting device module 720 into surface light and to supply the light to the liquid crystal display panel 710, a plurality of films 750, 766 and 764 to uniformize brightness of light from the light guide plate 730 and improve vertical incidence, and a reflective sheet 740 to reflect light emitted backward the light guide plate 730 to the light guide plate 730.

The light emitting device module 720 includes a plurality of light emitting device packages 724 and a PCB 722 on which the light emitting device packages 724 are mounted to form an array. In this case, reliability of mounting of the bent light emitting device packages 724 can be improved.

Meanwhile, the backlight unit 770 includes a diffusion film 766 to diffuse light incident from the light guide plate 730 toward the liquid crystal display panel 710, a prism film 752 to collect the diffused light and thus improve vertical incidence and a protective film 764 to protect the prism film 752.

Figure 11:
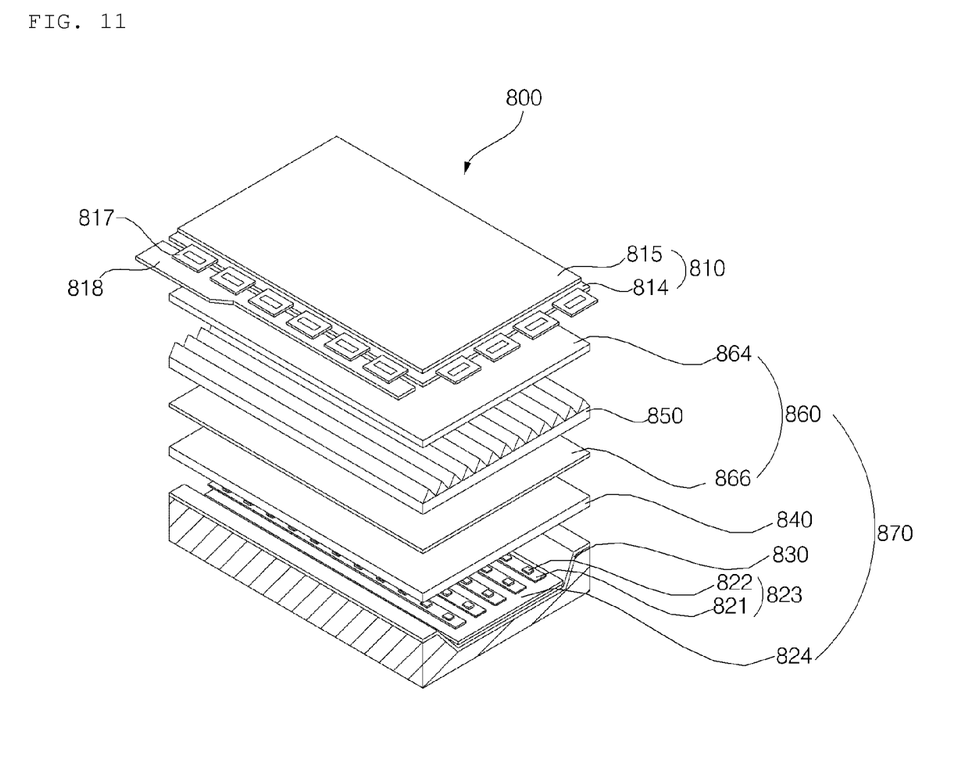
FIG. 11 is an exploded perspective view illustrating a liquid crystal device including a light emitting device according to another embodiment.

FIG. 11 is an exploded perspective view illustrating a liquid crystal display including a light emitting device according to an embodiment. Contents illustrated and described in FIG. 10 are not mentioned in detail.

FIG. 11 illustrates a direct-type liquid crystal display device 800 which includes a liquid crystal display panel 810 and a backlight unit 870 to supply light to the liquid crystal display panel 810.

The liquid crystal display panel 810 is described in FIG. 10 and a detailed explanation thereof is omitted.

The backlight unit 870 includes a plurality of light emitting device modules 823, a reflective sheet 824, a lower chassis 830 in which the light emitting device modules 823 and the reflective sheet 824 are accepted, a diffusion plate 840 disposed on the light emitting device modules 823, and a plurality of optical films 860.

Each light emitting device module 823 includes a plurality of light emitting device packages 822 and a PCB 821 on which the light emitting device packages 822 are mounted to form an array. The reflective sheet 824 reflects light generated by the light emitting device package 822 toward the liquid crystal display panel 810 to improve luminous efficacy.

Meanwhile, light generated by the light emitting device module 823 is incident on the diffusion plate 840 and an optical film 860 is disposed on the diffusion plate 840.

The optical film 860 includes a diffusion film 866, a prism film 850 and a protective film 864.

As apparent from the fore-going, in accordance with the light emitting device according to the embodiments, the metal contact portion is disposed to pass through the transparent electrode layer, thus advantageously easily ohmic-contacting the light emitting structure.

In addition, the metal contact portion passes through the transparent electrode layer, thus advantageously enabling heat generated by the light emitting structure to be readily discharged to the conductive substrate.

In addition, the metal contact portion directly contacts the light emitting structure, thus advantageously reducing forward voltage (VF).

An area of the metal contact portion is smaller than an area of the transparent electrode layer, thus advantageously reducing inhibition of travelling of light reflected by the metal reflective layer and improving luminous efficacy.

In addition, impurities are doped only in an area contacting the metal contact portion, thus advantageously forming ohmic-contact without greatly deteriorating luminous efficacy.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A light emitting device comprising:
a conductive substrate;
a first electrode layer disposed on the conductive substrate;
a light emitting structure disposed on the first electrode layer, the light emitting structure including a first semiconductor layer, a second semiconductor layer, and an active layer disposed between the first semiconductor layer and the second semiconductor layer; and
a second electrode layer electrically connected to the second semiconductor layer,
wherein the first electrode layer comprises:
a transparent electrode layer disposed between the conductive substrate and the first semiconductor layer; and
an ohmic layer comprising a plurality of metal contact portions vertically passing through the transparent electrode layer,
wherein each metal contact portion comprises AuBe.

2. The light emitting device according to claim 1, wherein the transparent electrode layer comprises at least one of $In_2O_3$, $SnO_2$, ZnO, ITO, CTO, $CuAlO_2$, $CuGaO_2$ and $SrCu_2O_2$.

3. The light emitting device according to claim 1, wherein a planar area of the transparent electrode layer is greater than a planar area of the metal contact portion.

4. The light emitting device according to claim 1, wherein a surface of the metal contact portion contacts the first semiconductor layer.

5. The light emitting device according to claim 1, wherein a surface of the metal contact portion contacts the conductive substrate.

6. The light emitting device according to claim 1, wherein the light emitting structure comprises AlGaInP or GaInP.

7. The light emitting device according to claim 1, further comprising a window layer disposed between the first electrode layer and the first semiconductor layer to reduce a reflectivity difference therebetween.

8. The light emitting device according to claim 1, wherein the first electrode layer further comprises a metal adhesive layer disposed under the ohmic layer.

9. A light emitting device comprising:
a conductive substrate;
a first electrode layer disposed on the conductive substrate;
a window layer disposed on the first electrode layer;
a light emitting structure disposed on the window layer, the light emitting structure including a first semiconductor layer, a second semiconductor layer, and an active layer disposed between the first semiconductor layer and the second semiconductor layer; and
a second electrode layer electrically connected to the second semiconductor layer, and
wherein the first electrode layer comprises:
a transparent electrode layer disposed between the conductive substrate and the window layer; and
an ohmic layer comprising a plurality of metal contact portions spaced from one another on the transparent electrode layer, the metal contact portions vertically passing through the transparent electrode layer,
wherein at least one surface of the metal contact portion contacts the window layer, and
the window layer comprises a doping region doped with a dopant having the same polarity as the first semiconductor layer in an area in which the window layer contacts the metal contact portion.

10. The light emitting device according to claim 9, wherein the window layer comprises GaP, GaAsP or AlGaAs.

11. The light emitting device according to claim 9, wherein the doping region is doped with a p-type dopant, and
a doping concentration is $5\times10^{18}/cm^3$ to $1\times10^{18}/cm^3$ when the doping region is doped with Mg.

12. The light emitting device according to claim 9, wherein the doping region is doped with a p-type dopant, and
a doping concentration is $5\times10^{19}/cm^3$ to $1\times10^{19}/cm^3$ when the doping region is doped with C.

13. The light emitting device according to claim 9, wherein the doping region protrudes from the surface of the window layer.

14. The light emitting device according to claim 9, wherein the metal contact portion comprises Au or a Au alloy.

15. The light emitting device according to claim 9, wherein the transparent electrode layer comprises at least one of $In_2O_3$, $SnO_2$, ZnO, ITO, CTO, $CuAlO_2$, $CuGaO_2$ and $SrCu_2O_2$.

16. The light emitting device according to claim 9, wherein a planar area of the transparent electrode layer is greater than a planar area of the metal contact portion.

17. The light emitting device according to claim 9, wherein a surface of the metal contact portion contacts the conductive substrate.

18. The light emitting device according to claim 9, wherein the light emitting structure comprises AlGaInP or GaInP.

19. The light emitting device according to claim 9, wherein the first electrode layer further comprises a metal adhesive layer disposed under the ohmic layer.

20. A light emitting device package comprising a light emitting device,
wherein the light emitting device comprises:
a conductive substrate;
a first electrode layer disposed on the conductive substrate;
a light emitting structure disposed on the first electrode layer, the light emitting structure including a first semiconductor layer, a second semiconductor layer, and an active layer disposed between the first semiconductor layer and the second semiconductor layer; and
a second electrode layer electrically connected to the second semiconductor layer,
wherein the first electrode layer comprises:
a transparent electrode layer disposed between the conductive substrate and the first semiconductor layer; and
an ohmic layer comprising a plurality of metal contact portions passing through the transparent electrode layer,
wherein each metal contact portion comprises AuBe.

* * * * *